(12) United States Patent
Fechner

(10) Patent No.: US 7,408,861 B2
(45) Date of Patent: Aug. 5, 2008

(54) RECORDING OR REPRODUCTION APPARATUS FOR OPTICAL RECORDING MEDIA HAVING MEANS FOR INCREASING THE RESOLUTION OF A DIGITAL-TO-ANALOG CONVERTER IN THE SERVO REGULATING CIRCUIT

(75) Inventor: Manfred Fechner, Villingen-Schwenningen (DE)

(73) Assignee: Thomson Licensing, Boulogne-Billancourt (FR)

( * ) Notice: Subject to any disclaimer, the term of this patent is extended or adjusted under 35 U.S.C. 154(b) by 595 days.

(21) Appl. No.: 11/004,407

(22) Filed: Dec. 3, 2004

(65) Prior Publication Data

US 2005/0122876 A1 Jun. 9, 2005

(30) Foreign Application Priority Data

Dec. 5, 2003 (DE) ............................ 103 57 033

(51) Int. Cl.
*G11B 7/00* (2006.01)
(52) U.S. Cl. ................ 369/59.21; 369/59.22
(58) Field of Classification Search ............ 369/124.09, 369/124.06, 124.05, 59.22, 59.21; 341/114, 341/144
See application file for complete search history.

(56) References Cited

U.S. PATENT DOCUMENTS

| 4,006,475 A | 2/1977 | Candy et al. |
| 5,170,387 A | 12/1992 | Groen |
| 5,969,656 A | 10/1999 | Itoku |
| 6,362,764 B1 * | 3/2002 | Niimi et al. ................. 341/144 |

FOREIGN PATENT DOCUMENTS

| DE | 38 54 744 T2 | 12/1998 |
| JP | 09 083368 A | 3/1997 |
| WO | WO 98/27653 | 6/1998 |

OTHER PUBLICATIONS

Search Report dated Jul. 26, 2004.
European Search Report dated Jun. 29, 2005.

\* cited by examiner

*Primary Examiner*—Nabil Hindi
(74) *Attorney, Agent, or Firm*—Joseph J. Laks; Robert D. Shedd

(57) ABSTRACT

The invention relates to a recording or reproduction apparatus for optical recording media having means for increasing the resolution of a digital-to-analog converter (DA), such as, for example, a digital-to-analog converter (DA) which is provided in the servo regulating circuit of a recording or reproduction apparatus and has a smaller bit width than its digital data source (DD). In order to increase the resolution or precision of the digital-to-analog converter (DA), a method and a circuit arrangement are provided by means of which less significant bits (L) of the digital data source (DD) are quantized and the quantization result is added to the value of more significant bits (H) of the digital data source (DD) with the exception of the maximum value of the more significant bits (H) for the purpose of increasing the resolution of the output signal of the digital-to-analog converter (DA). The resolution or precision of the digital-to-analog converter (DA) is improved without increasing the bit width of the digital-to-analog converter (DA) and, since the means for increasing the resolution of a digital-to-analog converter (DA) are provided exclusively in the digital domain, a smaller circuit volume is required for the digital-to-analog converter (DA) with means for increasing the resolution in comparison with the digital-to-analog converter having a corresponding bit width. The application of the invention is provided in particular for regulating circuits in which the bit width is greater than that of the digital-to-analog converter (DA).

12 Claims, 6 Drawing Sheets

Figure 1:
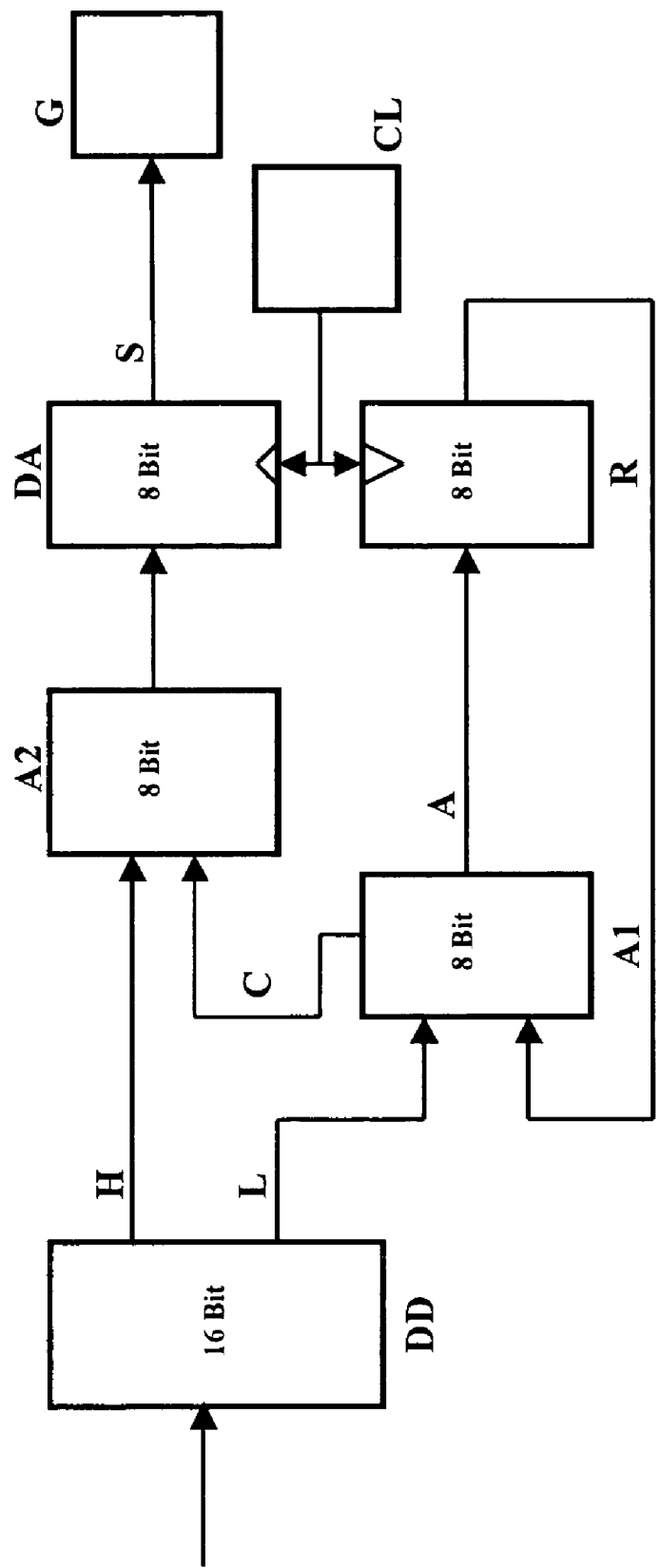

RECORDING OR REPRODUCTION APPARATUS FOR OPTICAL RECORDING MEDIA HAVING MEANS FOR INCREASING THE RESOLUTION OF A DIGITAL-TO-ANALOG CONVERTER IN THE SERVO REGULATING CIRCUIT

Recording or reproduction apparatus for optical recording media having means for increasing the resolution of a digital-to-analog converter in the servo regulating circuit.

This application claims the benefit, under 35 U.S.C. § 119 of German Patent Application 10357033.0, filed Dec. 5, 2003.

FIELD OF THE INVENTION

The invention relates to a recording or reproduction apparatus for optical recording media having means for increasing the resolution of a digital-to-analog converter in the servo regulating circuit such as is used for example for track regulation and/or focusing in a recording or reproduction apparatus for optical recording media. What are specified, in particular, are a method and an arrangement for increasing the resolution or precision of the digital-to-analog converter without increasing the bit width of the digital-to-analog converter.

BACKGROUND OF THE INVENTION

Examples of optical recording or reproduction apparatuses are CD or DVD players and recorders equipped by means of an optical scanning device, a so-called pick-up, to read data from an optical recording medium, a compact disk—abbreviated to CD—or a digital versatile disk—abbreviated to DVD—or to write data to the recording medium. By means of a track regulating circuit, the pick-up is guided such that the light beam—a laser beam—that reads the data of an optical recording medium or writes data to the optical recording medium is guided along the data tracks of the optical recording medium. By means of a focus regulating circuit, the laser beam is focused onto the optical recording medium or a data carrier plane of the optical recording medium and, if appropriate, a further regulating circuit is provided for perpendicularly orienting the laser beam onto the recording medium. The generic term servo regulating circuit is customary for regulating circuits of this type. Digital servo regulating circuits are preferably used in recording or reproduction apparatuses for optical recording media. A regulating deviation that occurs as an analog signal is digitized by means of an analog-to-digital converter, processed digitally and an actuating signal for reducing the regulating deviation is provided by means of a digital-to-analog converter, the resolution of which is generally smaller than that of the digitally processed signal. The resolution of the analog-to-digital converter is 16 bits, for example, or, in the case of a smaller resolution, is computed to 16 bits, for example, by oversampling and filters in the digital domain, while the resolution or bit width of the digital-to-analog converter is restricted to 8 bits, for example, generally for reasons of outlay for the digital-to-analog converter. On account of the small resolution of the digital-to-analog converter, the manipulated variable cannot be provided with a resolution or precision that corresponds to the analog regulating deviation. The resolution of an 8-bit digital-to-analog converter is approximately 10-20 µm in the case of tracking. However, the distance between the tracks is only 0.74 µm in the case of DVD and 1.6 µm in the case of CD. The manipulated variable or the actuating signal causes a regulating deviation which the regulator attempts to compensate for within the scope of the dynamic range of the regulating circuit. In the regulating circuit, this leads to an oscillation about the track with a frequency that lies below the transfer frequency of the regulating circuit of 1-2 kHz. Since this frequency is governed by the quantization and changes with the position of the track within the quantization level, it is also referred to as quantization noise. The setting of intermediate values or the averaging of the fluctuation range of the actuating signal is achieved by means of the low-pass filter characteristic of the actuator, which, in this frequency range, is formed exclusively by the mass or inertia of a motor or an actuator. The low-pass filter characteristic of >10 kHz formed by the winding has no influence on the quantization noise. However, the latter advantageously has the effect that, in addition to the deviations caused by disturbance variables, in a manner governed by the quantization noise, the actuator moves about the track center in the region of approximately 10% of the track spacing. In principle, it is possible to eliminate these disadvantages or to increase the resolution or precision of the actuating signal in recording or reproduction apparatuses for optical recording media having relatively high storage density by means of a digital-to-analog converter having a larger bit width. However, in addition to the increased outlay, digital-to-analog converters having a larger bit width also require a larger chip area in the analog region of a circuit, which, however, is disadvantageous particularly for integrated circuits having a high degree of integration.

SUMMARY OF THE INVENTION

Therefore, it is an object of the invention to increase the resolution of a digital-to-analog converter in the servo regulating circuit of a recording or reproduction apparatus for optical recording media without altering the bit width of the digital-to-analog converter, with a low outlay.

This object is achieved by means of the features specified in independent claims. Advantageous refinements are specified in dependent claims.

One aspect of the invention is to increase the resolution or precision of a digital-to-analog converter for a predetermined servo regulating circuit of a recording or reproduction apparatus for optical recording media for the purpose of providing an actuating signal having a higher resolution and for the purpose of reducing the quantization noise in the regulating circuit. Neither the bit width of the digital-to-analog converter nor the digital data source that provides the digital-to-analog converter with the data for digital-to-analog conversion are intended to be altered and, nevertheless, the predetermined digital-to-analog converter, with a low outlay, is intended to provide the actuator with an actuating signal having an increased resolution. Precise control of the actuator to a target value is of particular importance for example both for tracking in the case of a small or relatively small track spacing and generally for more precise control after an interruption of the regulation that is caused for example by scratches or soiling of the optical recording medium. Although the digital regulating or actuating signals are available in the servo regulating circuit with a bit width that is larger than the bit width of the digital-to-analog converter, the bit width of the digital-to-analog converter is not intended to be increased and the resolution or precision with which the digital-to-analog converter provides the analog actuating signal is nevertheless intended to be increased. Moreover, the intention is also not to alter the dynamic range of the regulating circuit as well as the limiting frequency and the low-pass filter characteristic of the actuator.

In the servo regulating circuit, only the more significant bits of a digital data source are fed to the digital-to-analog converter on account of the limitation of its bit width. The digital data source is for example a digital servo processor, the low-pass filter of a digital servo processor or a microcontroller having a clock frequency of 100 kHz, for example. The digital-to-analog converter is then generally likewise clocked with the frequency of the digital data source since the resolution and precision of the signal are already prescribed by the clock frequency and bit width of the digital data source, so that a higher resolution of the digital-to-analog converter cannot be achieved even with oversampling or a higher clock rate.

In order nevertheless to increase the resolution of the digital-to-analog converter or the resolution of the actuating signal provided by the digital-to-analog converter, a method and a circuit arrangement are provided which consist in the fact that the less significant bits of the digital data source, which are usually not fed to the digital-to-analog converter on account of the prescribed bit width of the digital-to-analog converter, are integrated and, as soon as the integration exceeds the quantization level, this level is added to the more significant bits, whilst simultaneously taking the quantization level from the integration of the less significant bits. The quantization level that is output is filtered or integrated in low-pass filter elements. Since this change is at high frequency, the low-pass filtering is already effected in the driver electronics, or in the winding of the actuator or motor. The mass only sees the filtered average value; the high-frequency modulation has no disadvantageous influence on the position of the mass of the actuator or motor. The mass only sees the analog average value that lies between the quantization levels of the digital-to-analog converter and corresponds to the 16-bit input value, for example. The mass can thus be positioned with a resolution of 16 bits and amounts to approximately 0.05 μm in the case of the actuator; the quantization noise is thus eliminated.

For the purpose of quantizing the less significant bits that are usually not fed to the digital-to-analog converter, a pulse density method and a pulse width method and also corresponding circuit arrangements are provided, which differ in the number of bit changeovers required. In the case of the pulse density method, the less significant bits are accumulated and an overflow that arises in this case is added to the digital value of more significant bits with the exception of the maximum value of the more significant bits. As a result, a filter that integrates the less significant bits is used for increasing the resolution of the digital-to-analog converter by integration of the less significant bits. The average value over time of integrated output signals of the digital-to-analog converter thereby has a comparatively higher resolution or precision with the same bit width. The overflows are added to the more significant bits of the digital data source with the exception of the maximum value of the more significant bits since incrementing the maximum value leads to a result outside the bit width of the digital-to-analog converter. The output of the digital-to-analog converter provides an actuating signal which, in terms of its average, corresponds to the target value to be realized with higher precision or resolution. The quantization noise is also reduced by virtue of the fact that control is effected to the target value with an increased resolution. Circuit arrangements for realizing the method are provided directly upstream of the digital-to-analog converter and only require assemblies with a bit width corresponding to the number of less significant bits. The digital-to-analog converter may be operated with a clock rate that corresponds to the digital data source or with a higher clock rate. In accordance with a first exemplary embodiment, the less significant bits that are usually not fed to the digital-to-analog converter on account of its bit width are added in a first adder and overflows that occur during the addition are then added to the more significant bits of the digital data source by means of a second adder. The sum formed by the second adder, which sum is limited to the maximum value of the more significant bits, is fed to the digital-to-analog converter, which provides an actuating signal having increased precision or resolution from the received sum with an increased pulse density. The data signal of a digital data source is transformed, by means of a digital-to-analog converter DA having a comparatively smaller bit width, into a corresponding signal with a resolution that is higher than the bit width of the digital-to-analog converter. With the measure of adding the less significant bits that go beyond the resolution or bit width of the digital-to-analog converter and of adding overflows that occur in this case to the more significant bits in the manner mentioned above, it is the case that, without increasing the bit width of the digital-to-analog converter, the resolution of the digital-to-analog converter is increased and the quantization noise is reduced without this requiring digital-to-analog converters and adders having a larger bit width. The output of the digital-to-analog converter provides a manipulated variable whose resolution corresponds to the resolution of a digital-to-analog converter having a correspondingly larger bit width. Thus, by way of example, the resolution of the output signal of an 8-bit digital-to-analog converter that is connected to a data source with 16-bit resolution is increased by 8 bits without altering the 8-bit bit width of the digital-to-analog converter.

Since the data rate with which the digital data source provides digital data is prescribed, it would be possible, with a digital-to-analog converter having a correspondingly larger bit width, which requires a considerably larger chip area in the analog domain, likewise to achieve only the resolution that corresponds to the digital data source. With a higher bit width of the digital-to-analog converter, however, in the case of an unaltered data rate of the digital data source, it is not possible either to increase the precision of the analog actuating signal or to further reduce the quantization noise. The averaging of the actuating signal that is provided taking account of less significant bits and with the same or an increased data rate is effected in a known manner by means of actuators having a low-pass filter behavior, such as, for example, the motor of the track regulating circuit or the actuator of the focus regulating circuit. The adders required for realizing the method are realized in the digital region of a circuit and thus require a smaller area in comparison with the digital-to-analog converter having a correspondingly larger bit width, so that the resolution and precision of a digital-to-analog converter having a predetermined bit width in the servo regulating circuit is increased with a low outlay.

However, the pulse density method, which increases the resolution even in the case of a relatively minor low-pass filter behavior of actuators connected to the digital-to-analog converter, leads to numerous changeovers of the digital-to-analog converter when the accumulation has a high clock rate. Since digital-to-analog converters generally have a far higher limiting frequency than signals processed in the servo regulating circuit, this is generally noncritical. In order nevertheless to reduce the number of required changeovers of the digital-to-analog converter, a pulse width method is provided in accordance with a second embodiment. In the case of the pulse width method, for the purpose of quantizing the less significant bits that are not fed to the digital-to-analog converter owing to a limited bit width, provision is made for comparing the value of the less significant bits with a value that rises periodically up to the maximum value of the less significant bits. The result of the comparison is then a bit whose status zero or one corresponds to the ratio of the time period over which the value of the less significant bits is greater or less than the value that rises periodically up to the maximum value of the less significant bits. The result of the quantization corresponds to the overflow—mentioned in connection with the pulse density method—with a smaller number of changeovers since the result of the quantization of less significant bits, in contrast to the number, is represented with the duration of increasing the value of the more significant bits. In the case of the pulse width method, the result of the quantization is likewise fed to an adder that is limited to the maximum value of the more significant bits. For realizing the method, a circuit arrangement is provided in which, in comparison with the pulse density method, the first adder is replaced by a comparator and the register is replaced by a counter. The resolution or precision of the digital-to-analog converter is increased without increasing the bit width of the digital-to-analog converter and, since the comparator and the counter are realized in the digital domain, a digital-to-analog converter having an increased resolution is realized with a low outlay and a small space requirement.

BRIEF DESCRIPTION OF PREFERRED EMBODIMENTS

Figure 2:
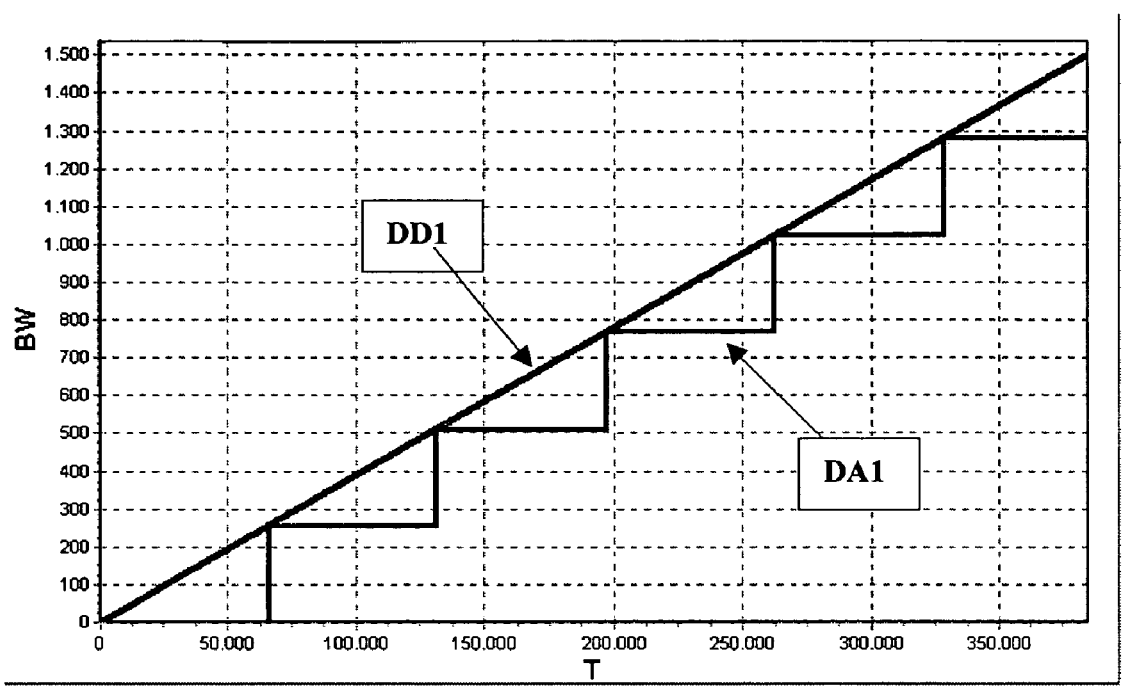
Figure 3:
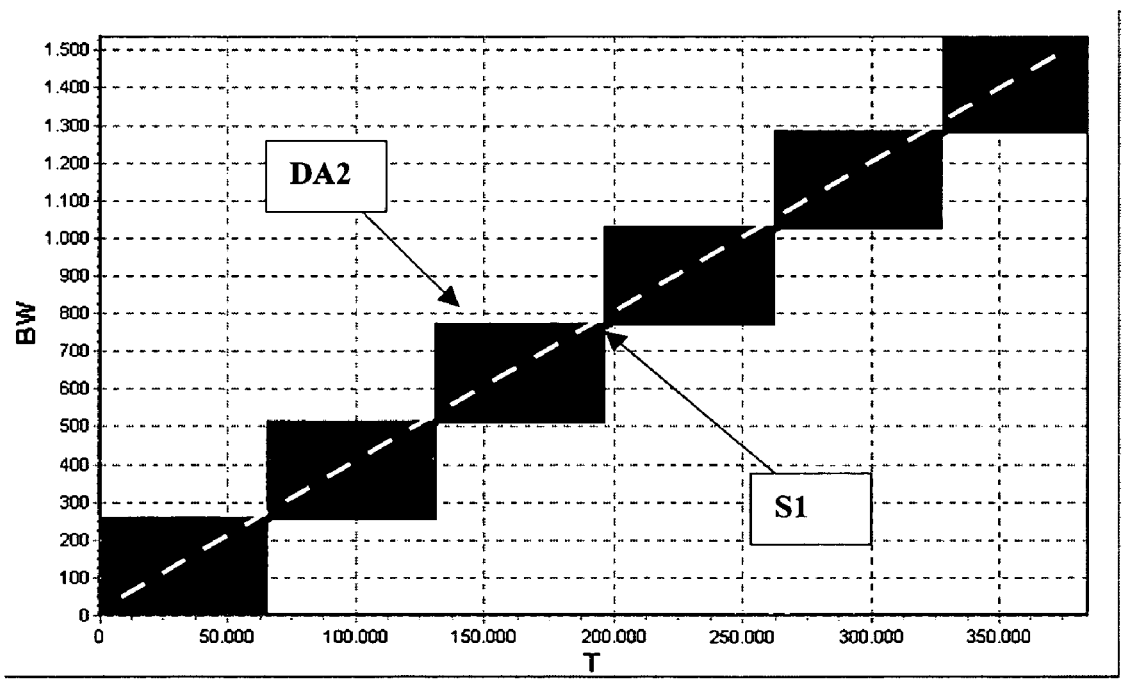
Figure 4:
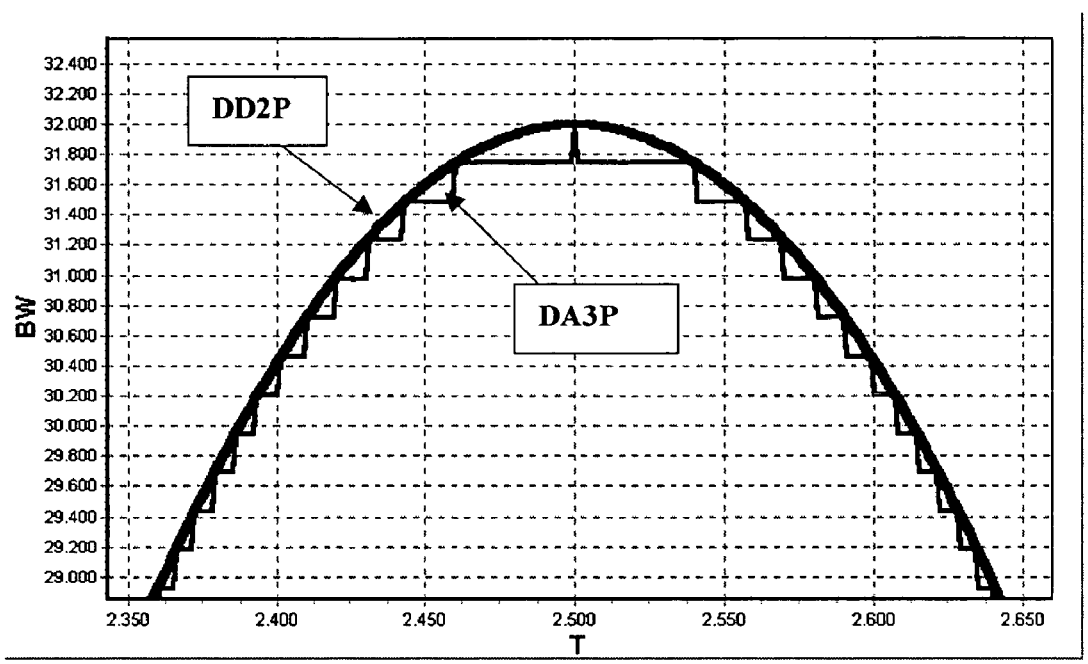
Figure 5:
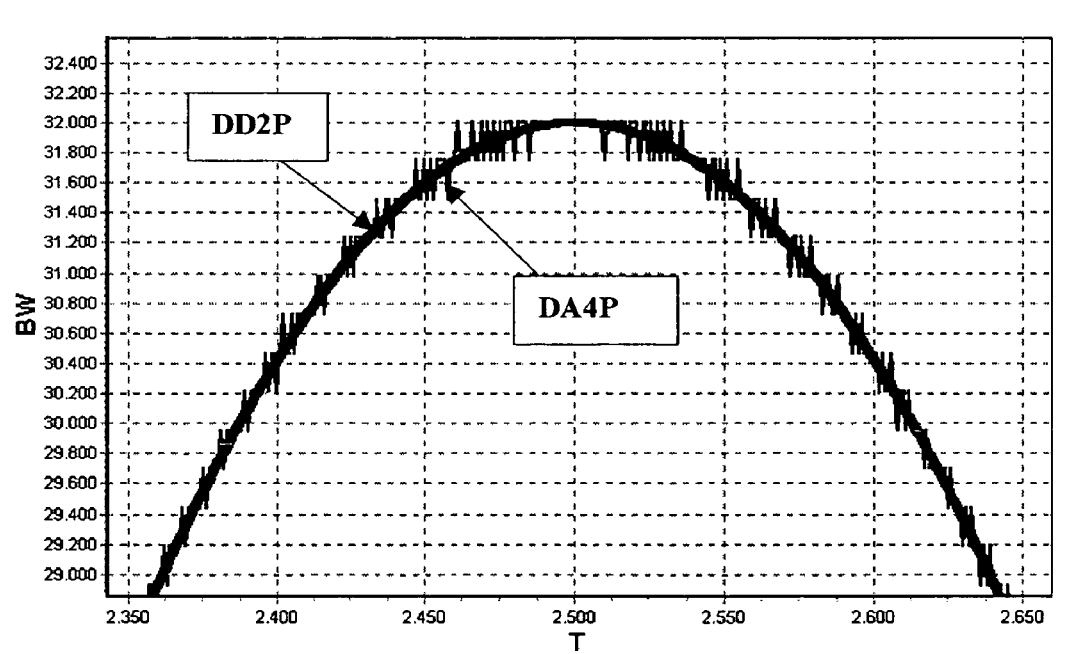
Figure 6:
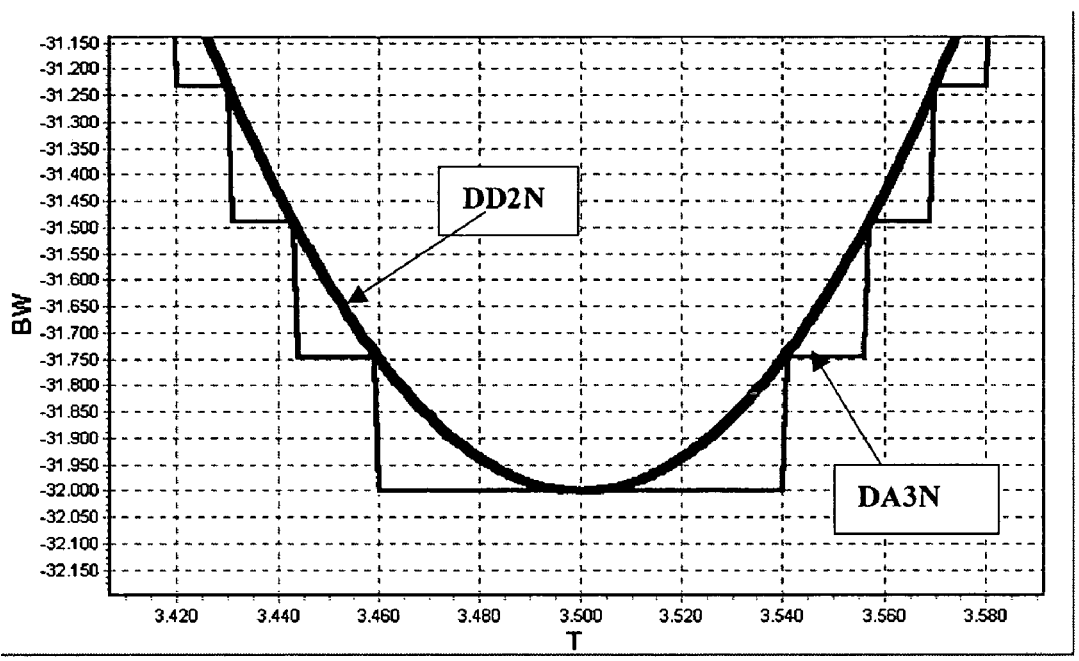
Figure 7:
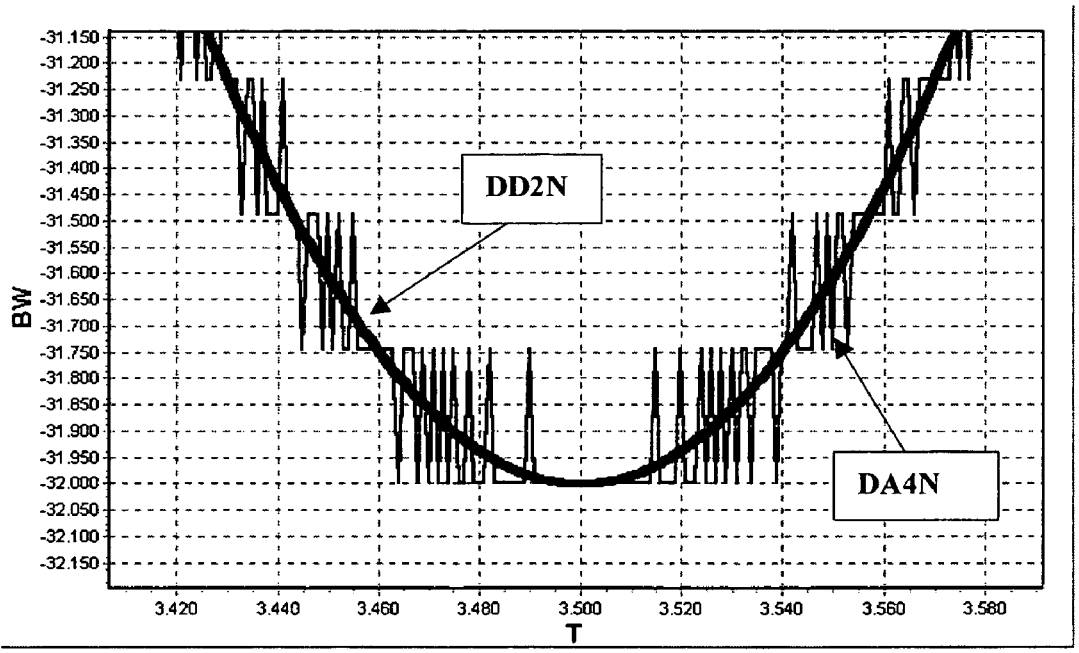
Figure 8:
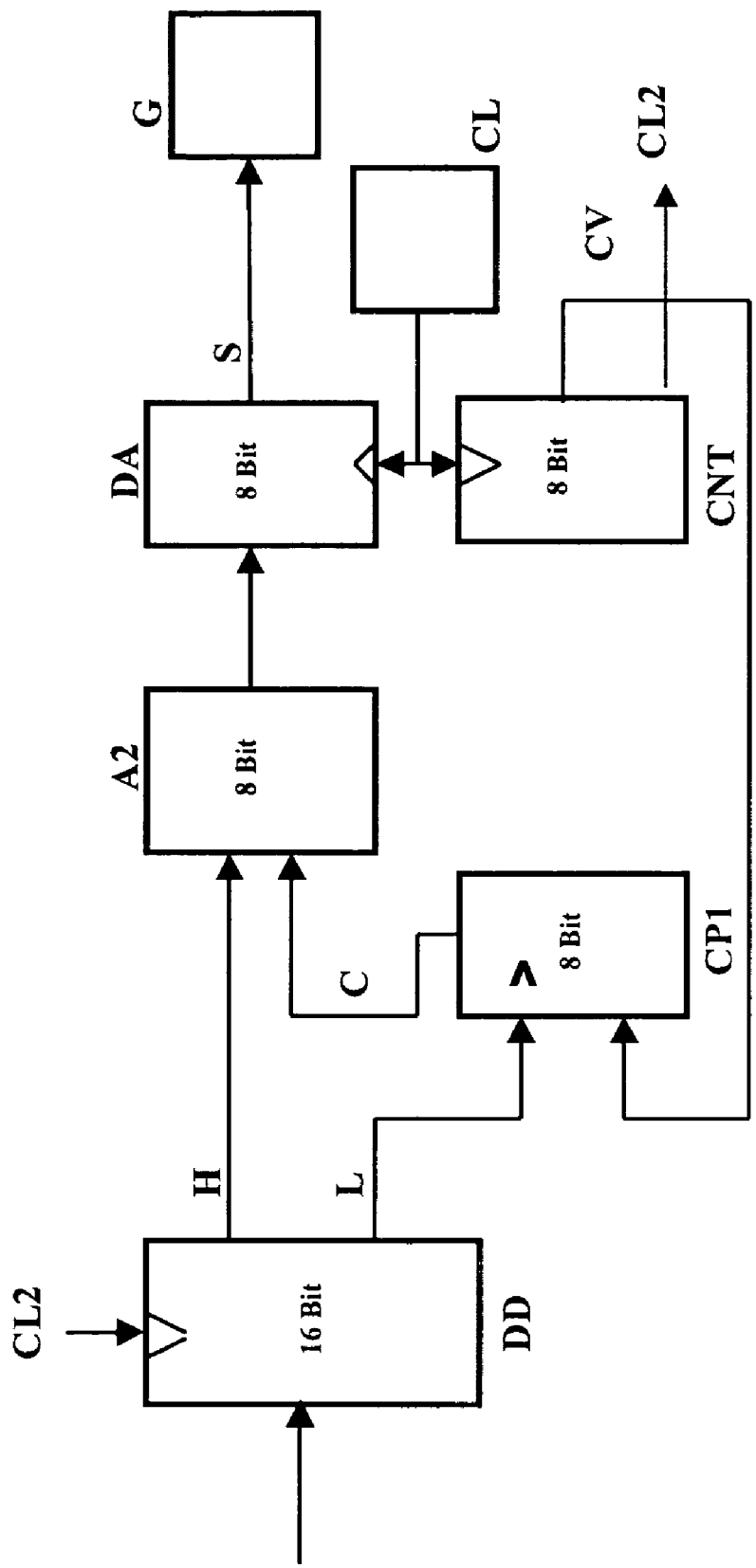
Figure 9:
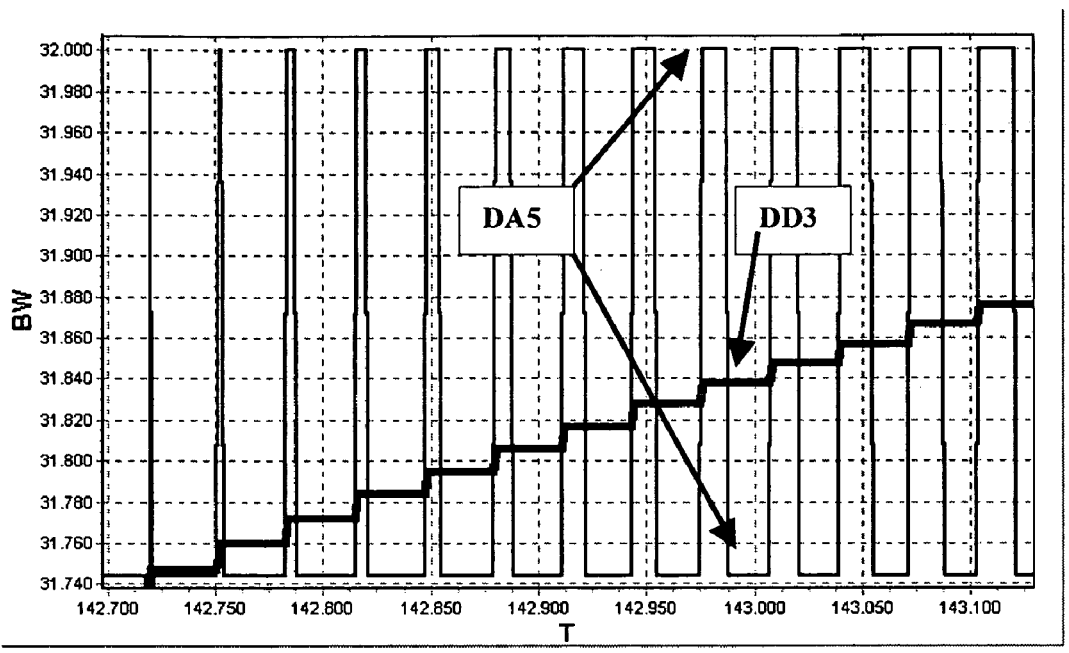
Figure 10:
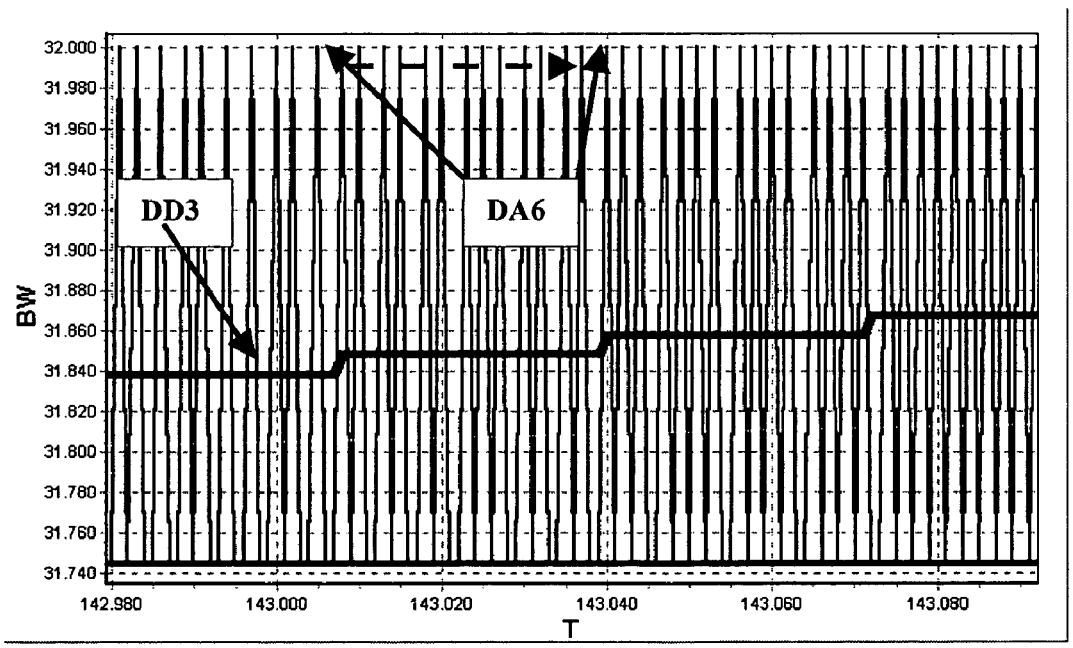

The invention is explained in more detail with reference to exemplary embodiments illustrated in drawings, in which:

FIG. 1 shows a block diagram of a first exemplary embodiment for increasing the resolution of a digital-to-analog converter in the servo regulating circuit, FIG. 2 shows a diagram of the binary values of a linearly rising data signal in the case of differing resolution, FIG. 3 shows a diagram of the binary values of a digital-to-analog converter having an increased resolution and as manipulated variable after low-pass filtering, FIG. 4 shows a diagram of the binary values of the positive half-cycle of a sinusoidal signal with a digital-to-analog converter having a predetermined bit width, FIG. 5 shows a diagram of the binary values of the positive half-cycle of a sinusoidal signal with a digital-to-analog converter having a predetermined bit width and with means for increasing the resolution, FIG. 6 shows a diagram of the binary values of the negative half-cycle of a sinusoidal signal with a digital-to-analog converter having a predetermined bit width, FIG. 7 shows a diagram of the binary values of the negative half-cycle of a sinusoidal signal with a digital-to-analog converter having a predetermined bit width and with means for increasing the resolution, FIG. 8 shows a block diagram of a second exemplary embodiment for increasing the resolution of a digital-to-analog converter in the servo regulating circuit, FIG. 9 shows a diagram of the binary values of a digital-to-analog converter having an increased resolution according to the pulse width method, and FIG. 10 shows a diagram of the binary values of a digital-to-analog converter having an increased resolution according to the pulse density method.

DETAILED DESCRIPTION OF PREFERRED EMBODIMENTS

The block diagram illustrated in FIG. 1 shows, in a first exemplary embodiment, means for increasing the resolution of a digital-to-analog converter DA in a servo regulating circuit (not illustrated) of a recording or reproduction apparatus for optical recording media. These means consist in the fact that a digital data source DD, whose more significant bits H are usually fed to the digital-to-analog converter DA, has connected to it an accumulator for less significant bits L of the digital data source DD and an incrementer, to which the more significant bits H and the overflows of the accumulator are fed. The more significant bits H of the digital data source DD are incremented with the overflows of the accumulator with the exception of the maximum value of the more significant bits H. The accumulator is a register that is formed as a buffer memory and, in the exemplary embodiment, is formed with a first adder A1 and a register R. The less significant bits L of the digital data source DD are fed to the first adder A1, to whose output A the register R is connected, are summed in the register R and fed back from the output of the register R to an input of the first adder A1. As a result, overflows C arise in the first adder A1 and are fed to the incrementer, formed with a second adder A2, to which the more significant bits H are fed. The incrementer or second adder A2 is limited to the bit width of the digital-to-analog converter DA in such a way that the more significant bits H with the exception of the maximum value of the more significant bits H are incremented with the overflow C of the first adder A1. In the embodiment illustrated, the digital-to-analog converter DA connected to the second adder A2, which digital-to-analog converter provides, in the regulating circuit, a manipulated variable S for reducing the regulating deviation of an actuator G or for controlling the actuator G to a predetermined value in the event of an interruption or in the event of an open regulating circuit, is clocked by means of a clock generator CL that provides a clock rate that corresponds to the digital data source DD or is preferably a higher clock frequency. The register R is also controlled with this clock frequency. In the exemplary embodiment illustrated, the digital data source DD, which is for example a digital servo processor, the low-pass filter of a digital servo processor or a microcontroller, has a bit width of 16 bits that is provided with a clock frequency of 100 kHz. From the 16 bits provided as a digital control signal or as a regulating signal with a, for example, preceding oversampling, interpolation and filtering, known servo regulating circuits frequently use exclusively eight more significant bits H, which are fed to the second adder A2 in accordance with FIG. 1. Given a predetermined bit width of eight bits for the digital-to-analog converter DA and with a predetermined digital data source DD that provides 16 bits at 100 kHz, the resolution for a manipulated variable S and the quantization noise in the servo regulating circuit of a recording or reproduction apparatus for optical recording media appear to be defined without altering other parameters of the regulating circuit. Nevertheless, the precision or resolution of the manipulated variable S is increased and the quantization noise is reduced by the means specified in FIGS. 1 and 8. The term manipulated variable S denotes, in a regulating circuit, the output of a regulator which is used to influence the actuator G of the regulating circuit for reducing the regulating deviation. Actuators G are for example the focus actuator or a drive system—generally comprising fine drive and coarse drive—for guiding the scanning or recording beam on the track of the optical recording medium. Quantization noise is a noise effect of digital signals that is dependent on the number of digital level steps used in the quantization. The quantization noise represents the difference between the instantaneously valid sample and the original signal. The higher the resolution of the quantization, the lower the quantization noise becomes.

In accordance with the exemplary embodiment illustrated in FIG. 1, the outputs of the digital data source DD at which the more significant bits H can be tapped off are connected to inputs of the second adder A2, while those outputs at which the less significant bits L are present are connected to inputs of the first adder A1. The digital data source DD having a bit width of 16 bits provides eight more significant bits H and eight less significant bits L in accordance with the bit width of the digital-to-analog converter DA. The eight less significant bits L are fed to the first adder A1, which is an eight and eight bit adder and the output A of which is connected to the input of the register R, the output of which is coupled with feedback to the input side of the first adder A1. In the register R, eight less significant bits L that are fed to the register R via the first adder A1 are summed with the clock frequency applied to the register R and are fed back to the first adder A1, so that an overflow C referred to as a carry is produced in the first adder A1. In order that the resolution of the manipulated variable S provided by means of the eight-bit digital-to-analog converter DA is increased by eight bits in accordance with the digital data source DD that provides a 16 bit word at 100 kHz, it is necessary to provide a clock frequency of the clock generator CL that is likewise 100 kHz or has a higher value. The carry or overflow C is fed to the second adder A2, which is an eight bit and one bit adder with a limitation to eight bits. The overflows C with which the more significant bits H are incremented with the exception of the maximum value of the more significant bits in the second adder A2 have the effect that the digital-to-analog converter DA provides a manipulated variable S having a precision or resolution increased by eight bits. In this exemplary embodiment, the resolution of the digital data source DD is 16 bits, while the resolution of the remaining components, of the adders A1 and A2, of the register R and also of the digital-to-analog converter DA, is only eight bits. Although the bit width of the digital-to-analog converter DA has not been altered, the measure of adding the less significant bits L and of adding overflows C that occur in this case to the more significant bits H achieves approximately the same resolution or precision as when using a digital-to-analog converter DA having a correspondingly larger bit width. It suffices, therefore, to provide a correspondingly high resolution only for the analog-to-digital converter or the digital regulator, while a significantly smaller bit width may be provided for the rest of the components, such as the digital-to-analog converter DA, in particular, in order to achieve, in the servo regulating circuit, virtually the same resolution as is expected in the case of the realization with components having a correspondingly higher bit width. The realization of the circuit arrangement specified in FIG. 1 requires a low outlay and a small space requirement on an integrated circuit or is embodied as a software solution that simulates the function of the circuit arrangement with mathematical means. A particular contribution to reducing the outlay is made by the fact that the means for increasing the resolution of the digital-to-analog converter DA are provided in the digital domain. By integrating the less significant bits L of the digital data source DD and incrementing the more significant bits H, a sum of the more significant bits H is formed and is fed to the digital-to-analog converter DA taking account of the conditions that the bit width of the digital-to-analog converter DA is not exceeded. This prevents a result outside the bit width of the digital-to-analog converter DA upon reaching the maximum value of the more significant bits H. Otherwise, the digital-to-analog converter DA outputs the value of the more significant bits H or a value increased by one bit of the more significant bits H. The value of the more significant bits H is increased by one bit of the more significant bits H in accordance with the integration result of the less significant bits L.

Increasing the resolution of a digital-to-analog converter DA in the servo regulating circuit is illustrated with reference to the diagrams illustrated in FIGS. 2 to 7, which illustrate binary values BW against a number of clock cycles T of the digital-to-analog converter DA. In a line DD1 that appears as a straight line on account of excessively low resolution, FIG. 2 shows the binary values BW of a digital data source DD in 16-bit resolution, the data of which are provided at 100 kHz and are increased by a binary value BW of 1 after 256 clock cycles T in each case. By virtue of the fact that the binary value BW is increased by a binary value BW after 256 clock cycles T in each case and a clock frequency of the digital-to-analog converter DA of 25.6 MHz was chosen in this exemplary embodiment, a known 8-bit digital-to-analog converter DA to which only the more significant bits H of the digital data source DD are fed outputs a binary value BW of 256 only after 66 536 clock cycles T. The output signal DA1 of the digital-to-analog converter DA to which only the more significant bits H are fed in a known manner thus has a stepped nature that is illustrated in FIG. 2 and increases by a binary value BW corresponding to 256 only after 66 536 clock cycles T in the case of an input signal that continuously rises by a binary value every 256 clock cycles. Despite a high clock frequency of the digital-to-analog converter DA of 25.6 MHz, the output signal DA1—illustrated in FIG. 2—of the digital-to-analog converter DA to which only the more significant bits H are fed in a known manner has only a low resolution. Therefore, the setting of intermediate values within the steps of the output signal DA1 of the digital-to-analog converter DA, as is necessary for example after an interruption of the regulating circuit or for adjustment processes in a servo regulating circuit, is not possible with sufficient precision. A resultant deviation from a desired target value is only compensated for by corresponding control in a regulating circuit and, if appropriate, after a relatively long transient recovery period. Since the output signal DA1 cannot be set precisely to the desired target value between the possible output values of the digital-to-analog converter DA, the regulator is disadvantageously loaded with a fundamental oscillation, also referred to as quantization noise. In order to eliminate these disadvantages of known digital-to-analog converters DA in servo regulating circuits without increasing the bit width of the digital-to-analog converter DA, the integrating of the less significant bits L as specified above is provided. With the abovementioned parameters and the circuit arrangement which is specified in FIG. 1 and with which, by way of example, the proposed method is carried out, the digital-to-analog converter DA generates an output signal DA2, which is illustrated in FIG. 3 and appears as strung-together black rectangles on account of the resolution (which cannot be illustrated in FIG. 3). In actual fact, the rectangles are individual pulses which, in terms of their average, correspond to the line DD1 that is illustrated in FIG. 2 and specifies the binary values BW of a digital data source DD in 16-bit resolution, the data of which are provided at 100 kHz and are increased by a binary value BW of 1 after 256 clock cycles T in each case. An actuating signal S1, illustrated as an interrupted white line in FIG. 3, is then formed by means of a 100 kHz low-pass filter at the output of the digital-to-analog converter DA, which is formed for example by the actuator G connected to the output of the digital-to-analog converter DA or by means of an additional low-pass filter. A comparison between the actuating signal S1 in FIG. 3 and the binary values BW —illustrated as line DD1 in FIG. 2 —of the digital data source DD in 16-bit resolution shows that the 8-bit digital-to-analog converter DA, with no increase in its bit width, provides an output signal DA2 corresponding to the digital data source DD in 16-bit resolution.

The solution proposed here advantageously provides an actuating signal S1 which, with regard to its resolution or precision, corresponds to the signal that a 16-bit digital-to-analog converter DA would provide with the disadvantage of the larger space requirement in a circuit. The resolution of a digital-to-analog converter DA in the servo regulating circuit is increased by the specified means without increasing its bit width. By virtue of the fact that the digital-to-analog converter DA provides the actuating signal S1 having a comparatively higher resolution, intermediate values within the known steps can be set directly, so that, immediately after an interruption of the regulating circuit, a desired target value or target value provided by the digital data source DD is provided to the actuator G with corresponding precision without delay. In order to further illustrate the advantages of the solution specified here, FIGS. 4 to 6 illustrate sinusoidal signals of the digital data source DD such as generally occur in a servo regulating circuit, and the corresponding output signals with and without the specified means for increasing the resolution of the digital-to-analog converter DA. FIGS. 4 and 5 illustrate the binary values BW of a positive sinusoidal signal DD2P and FIGS. 6 and 7 illustrate the binary values BW of a negative sinusoidal signal DD2N of the digital data source DD which has a bit width of 16 bits and provides data at a frequency of 100 kHz. In the exemplary embodiment chosen here, the digital-to-analog converter DA transforms the data signal of the digital data source DD into an analog signal with a frequency of 25.6 MHz. A known digital-to-analog converter DA having a bit width of 8 bits then provides at its output a stepped signal DA3P illustrated in FIG. 4. The positive, stepped signal DA3P of the digital-to-analog converter DA without means for increasing the resolution is, as illustrated in FIG. 4, essentially and generally on average smaller than the positive, sinusoidal signal DD2P of the digital data source DD and has only a small number of correspondences with the latter. Intermediate values cannot be generated directly and can be generated only with a regulation if appropriate only after a plurality of control processes of the regulator and with corresponding low-pass filtering. With the means for increasing the resolution of the digital-to-analog converter DA, the digital-to-analog converter DA, which likewise has only a bit width of 8 bits, provides at its output a signal DA4P which has an increased resolution and on average corresponds exactly to the positive, sinusoidal signal DD2P of the digital data source DD. On the basis of the increased number of correspondences between the signal DA4P at the output of the digital-to-analog converter DA and the signal DD2P of the digital data source DD, it already becomes clear that a desired target value is set more rapidly and with increased precision. A virtually complete correspondence between the signal DD2P of the digital data source DD and the signal at the output of the digital-to-analog converter DA is achieved by means of a low-pass filtering that is formed for example by an actuator G connected to the digital-to-analog converter DA with a 100 kHz low-pass filter characteristic.

By analogy with FIGS. 4 and 5, the effect achieved with the means for increasing the resolution of the digital-to-analog converter DA can also be discerned with reference to FIGS. 6 and 7 for a negative, sinusoidal signal DD2N of the digital data source DD. The output signal DA3N of the digital-to-analog converter DA without means for increasing the resolution of the digital-to-analog converter DA is on average smaller and has both a lower resolution and precision in comparison with the output signal DA4N of the digital-to-analog converter DA with the abovementioned means for increasing the resolution of the digital-to-analog converter DA, even though a digital-to-analog converter DA having a bit width of 8 bits is used correspondingly in both cases.

In addition to the abovementioned exemplary embodiment in which the resolution of the digital-to-analog converter DA is increased by incrementing the value of the more significant bits with the result of a quantization of the less significant bits which is based on a pulse density method, a second exemplary embodiment is specified, comprising a pulse duration or pulse width method. For comparison, FIGS. 9 and 10 illustrate the output signals DA5, DA6 of a digital-to-analog converter DA having increased resolution for the different methods, in which case, in order to facilitate the illustration, a different scaling of the number of clock cycles T has been effected and a quantization of five less significant bits is illustrated. In FIGS. 9 and 10, the digital data source DD having a bit width of 16 bits correspondingly provides binary values BW having a profile DD3 that increases approximately by the value 10 in each case after 32 clock cycles T. The stepwise increase in the binary value BW of the digital data source DD having the profile DD3 in the case of the quantization of less significant bits according to the pulse width method illustrated in FIG. 9 leads to an alteration of the ratio of the duration in which the digital-to-analog converter DA provides the higher or lower analog signal value. With a rising value of the less significant bits L within the resolution stages of the digital-to-analog converter DA, the time period over which the digital-to-analog converter DA provides the higher value increases. The output signal of the digital-to-analog converter DA is similar to a pulse width modulation, so that the term pulse width method has been chosen for this type of quantization of less significant bits L even though the method for increasing the resolution of the digital-to-analog converter DA, despite maintaining its bit width, is not based on a modulation of the more significant bits H. The term quantization expresses an assessment of the value of less significant bits L which influences the more significant bits H and is reflected in the outputting of analog signals of the digital-to-analog converter DA with increased precision or resolution. The term quantization, which usually identifies the number of digital level stages that are used during the analog/digital conversion, is used here synonymously for a digital level stage whose output frequency or output duration corresponds to the value of less significant bits L and influences the value of the more significant bits H with the exception of the maximum value of the more significant bits H. The output duration of a more significant bit H quantizes the value of less significant bits L by means of the pulse width method and the output frequency of a more significant bit H quantizes the value of less significant bits L by means of the pulse density method. Consequently, the term quantization is used here in accordance with its general definition that denotes a method for compensating for inaccuracies.

Increasing the resolution of the digital-to-analog converter DA by means of the pulse density method, as is illustrated in FIG. 10 and was explained in the first exemplary embodiment, is based on the fact that the digital-to-analog converter DA outputs the higher analog signal of its stage with a frequency that corresponds to the value of the less significant bits L. In this case, the frequency range with which the outputting is effected is relatively independent of the frequency with which the digital data source DD provides data. This makes it possible to use high frequencies, so that a minor low-pass filter behavior of the actuator G or the connection capacity of a circuit already suffices for filtering or analog signal formation with high precision. With a high clock frequency or number of clock cycles T of the digital-to-analog converter DA per unit time, a quasi-analog signal is then already provided at the output of the digital-to-analog converter DA. The advantage of quantization by means of the pulse density method consequently consists in the higher speed and better filter property of the output signal DA6 of the digital-to-analog converter DA.

On account of the lower number of changeovers of the digital-to-analog converter DA during quantization according to the pulse width method, fewer changeover errors occur during the pulse width method, the result of which is illustrated in FIG. 9. On the other hand, for a complete or precise quantization of less significant bits L by means of the pulse width method, it is necessary to take account of a dependence in connection with the frequency or with respect to a clock cycle CL2 with which the digital data source DD provides data. For realizing the quantization of less significant bits L by means of the pulse width method, use is made of a circuit arrangement illustrated as a block diagram in FIG. 8. As illustrated in FIG. 8, the digital data source DD has connected to it a comparator CP1, to which less significant bits L of the digital data source DD are fed, and an adder A2, to which more significant bits H of the digital data source DD are fed. In this case, the adder A2 and elements connected downstream of the adder A2, such as the digital-to-analog converter DA and the actuator G, correspond to the elements of the first exemplary embodiment illustrated in FIG. 1. The digital-to-analog converter DA and a counter CNT, which preferably has a bit width corresponding to the comparator CP1 and the number of less significant bits, are driven by means of a clock generator CL that preferably provides a clock cycle that corresponds to the system clock cycle of the regulating circuit (not illustrated) or a clock cycle that is derived therefrom. The counter CNT then generates a clock cycle CL2 that reduces the clock frequency of the clock generator CL by the bit width of the counter CNT and a count CV that rises periodically with the clock cycles of the clock generator CL up to the bit width of the counter CNT. The output providing the count CV of the counter CNT is connected to a second input of the comparator CP1 and the output that provides the clock cycle CL2 reduced by the bit width of the counter CNT is connected to the clock input of the digital data source DD. The control of the digital data source DD with the clock cycle CL2 reduced by the bit width of the counter CNT ensures that it is possible to carry out a quantization of less significant bits L by means of the pulse width method, which requires a mark-space ratio to be realized within a predetermined interval. Less significant bits L are fed to the comparator CP1 unchanged in each case for a time period that corresponds to the reduced clock cycle CL2. During this time period, in the comparator CP1, the value of the less significant bits L is compared with the rising count CV that is provided by the counter CNT, so that an overflow C arises at the output of the comparator CP1 during a clock period of the clock cycle CL2, the status zero or one of which overflow corresponds to the ratio of the present value of less significant bits L to the maximum value of the less significant bits L. The output of the comparator CP1 that forms the overflow C is connected to an input of the adder A2, so that, within a clock period of the clock cycle CL2, the value of the more significant bits H is increased by one bit for a time period, which corresponds to the ratio of the present value of less significant bits L to the maximum value of the less significant bits L. However, increasing the value of the more significant bits H is carried out only up to the maximum value of the more significant bits H in order to prevent a result outside the bit width of the digital-to-analog converter DA.

Less significant bits L of the digital data source DD are accumulated as a pulse width ratio and the more significant bits H of the digital data source DD are incremented with the accumulation of the less significant bits L with the exception of the maximum value of the more significant bits H, thereby increasing the precision or resolution of the output signal of the digital-to-analog converter DA.

Since a digital-to-analog converter DA having a bit width of 16 bits requires a larger area or a larger space in comparison with a digital-to-analog converter DA having a bit width of 8 bits, particularly in the analog region of a circuit, the methods and arrangements can also advantageously be employed in the cases in which a large number of electronic components are to be arranged on a small space, such as, for example, on so-called single-chip circuits. Exclusively digital circuit elements, which take up comparatively a significantly smaller space, are used as means for increasing the resolution of the digital-to-analog converter DA. In digital servo regulating circuits, the quantization noise is reduced without increasing the bit width of the digital-to-analog converter DA and the resolution of the digital-to-analog converter DA is increased. In principle, the method and the arrangement can also be combined with other known methods for increasing the precision of the digital-to-analog converter, such as, for example, so-called noise shaping.

The embodiments described here are specified only as examples and a person skilled in the art can realize other embodiments of the invention which remain within the scope of the invention.

The invention claimed is:

1. A recording or reproduction apparatus for optical recording media having a servo regulating circuit and means for increasing the resolution of a digital-to-analog converter, which has a smaller bit width than its digital data source in the servo regulating circuit, wherein less significant bits of the digital data source are quantized by means of a pulse density method or a pulse width method and the quantization result is added to the value of more significant bits of the digital data source with the exception of the maximum value of the more significant bits by an incrementer arranged between the digital data source providing the more significant bits and the digital-to-analog converter, which integrates the quantization result for increasing the resolution and precision of the output signal of the digital-to-analog converter, which is operated with a clock rate at least corresponding to the clock rate of the digital data source.

2. The recording or reproduction apparatus according to claim 1, wherein an accumulator or a comparator with a counter connected thereto having a bit width that is less than or equal to the bit width of the digital-to-analog converter is used for quantizing less significant bits of the digital data source.

3. The recording or reproduction apparatus according to claim 1, wherein, for the purpose of increasing the resolution of the output signal of the digital-to-analog converter by quantizing less significant bits of the digital data source by means of a pulse density method, less significant bits of the digital data source are accumulated and more significant bits of the digital data source are incremented with an accumulation of the less significant bits with the exception of the maximum value of the more significant bits.

4. The recording or reproduction apparatus according to claim 1, wherein, for the purpose of increasing the resolution of the output signal of the digital-to-analog converter by quantizing less significant bits of the digital data source by means of a pulse width method, less significant bits of the digital data source are compared with a count that rises within a clock period of the digital data source, and more significant bits of the digital data source are incremented with the result of the comparison with the exception of the maximum value of the more significant bits.

5. The recording or reproduction apparatus according to claim 3, wherein, for the purpose of incrementing the more significant bits with the exception of the maximum value of the more significant bits, an overflow of the accumulation of less significant bits of the digital data source is added to the more significant bits.

6. The recording or reproduction apparatus according to claim 3, wherein less significant bits that are provided by the digital data source but are not fed to the digital-to-analog converter are accumulated by means of a first adder to which a register coupled with feedback to the adder is connected, and an overflow that occurs during accumulation in the first adder is added to the more significant bits with the exception of the maximum value of the more significant bits by means of a second adder.

7. The recording or reproduction apparatus according to claim 4, wherein, for the purpose of incrementing the more significant bits with the exception of the maximum value of the more significant bits, an overflow whose duration corresponds to the value of less significant bits within a clock period of the digital data source is added to the more significant bits.

8. The recording or reproduction apparatus for optical recording media having a servo regulating circuit and means for increasing the resolution of a digital-to-analog converter, which has a smaller bit width than its digital data source in a servo regulating circuit, wherein an incrementer is arranged between the digital data source and the digital-to-analog converter and said incrementer increments more significant bits of the digital data source with an overflow integrating the less significant bits provided by an accumulator or a comparator with a counter connected thereto for the less significant bits with the exception of the maximum value of the more significant bits and the accumulator or the comparator with a counter connected thereto and the digital-to-analog converter operate with a clock rate at least corresponding to the clock rate of the digital data source and which are used for increasing the resolution and precision of the output signal of the digital-to-analog converter.

9. The recording or reproduction apparatus according to claim 8, wherein the accumulator is a first adder with a data register, which is connected to the output of the first adder and whose output is coupled with feedback to an input of the first adder, and the incrementer is a second adder that is limited with regard to its bit width in accordance with the bit width of the digital-to-analog converter.

10. A recording or reproduction apparatus for optical recording media having a servo regulating circuit and means for increasing the resolution of a digital-to-analog converter, which has a smaller bit width than its digital data source in the servo regulating circuit, wherein the digital-to-analog converter is connected to the digital data source via an incrementer that is connected to the terminals providing more significant bits of the digital data source and, for incrementing, to an overflow of a quantization circuit that is connected to the terminals providing less significant bits of the digital data source integrating the less significant bits provided by the quantization circuit for the less significant bits with the exception of the maximum value of the more significant bits.

11. The recording or reproduction apparatus according to claim 10, wherein the quantization circuit is a first adder connected to the terminals providing less significant bits of the digital data source with a data register, which is connected to the output of the first adder and whose output is coupled with feedback to an input of the first adder, the digital-to-analog converter and the data register are connected to a clock generator, the first adder has the overflow, and the incrementer is a second adder that is correspondingly limited with regard to its bit width in accordance with the bit width of the digital-to-analog converter.

12. The recording or reproduction apparatus according to claim 10, wherein the quantization circuit is a comparator connected to the terminals providing less significant bits of the digital data source, the output of said comparator forming the overflow and said comparator being connected to a counter that provides rising or decreasing counts and provides a clock cycle reduced in accordance with the bit width of the counter for the digital data source by means of a clock generator connected to the counter and the digital-to-analog converter.

* * * * *